United States Patent
Massler et al.

(10) Patent No.: US 6,740,393 B1
(45) Date of Patent: May 25, 2004

(54) DLC COATING SYSTEM AND PROCESS AND APPARATUS FOR MAKING COATING SYSTEM

(75) Inventors: Orlaw Massler, Feldkirch (AT); Mauro Pedrazzini, Eschen (AT); Christian Wohlrab, Feldkirch (AT); Hubert Eberle, Balzers (AT); Martin Grischke, Balzers (AT)

(73) Assignee: Balzers Aktiengesellschaft, Balzers (LI)

( * ) Notice: Subject to any disclaimer, the term of this patent is extended or adjusted under 35 U.S.C. 154(b) by 0 days.

(21) Appl. No.: 09/551,883

(22) Filed: Apr. 18, 2000

(30) Foreign Application Priority Data

Apr. 12, 2000 (DE) .......................................... 100 18 143

(51) Int. Cl.$^7$ ................................................ B32B 9/00
(52) U.S. Cl. ...................... 428/216; 428/336; 428/469; 428/472; 428/408; 428/698
(58) Field of Search ................................ 428/408, 698, 428/472, 469, 336, 216

(56) References Cited

U.S. PATENT DOCUMENTS 4,525,417 A * 6/1985 Dimigen et al.

(List continued on next page.)

FOREIGN PATENT DOCUMENTS

DE 19825983 * 3/1999

(List continued on next page.)

*Primary Examiner*—Archene Turner
(74) *Attorney, Agent, or Firm*—Crowell & Moring LLP

(57) ABSTRACT

A process and an arrangement are described by means of which it is possible to generate a layer system for the protection against wear, for the protection against corrosion and for improving the sliding properties or the like, which has an adhesive layer for the arrangement on a substrate, a transition layer for the arrangement on the adhesive layer and a cover layer of an adamantine carbon, the adhesive layer comprising at least one element from the Group which contains the elements of the 4th, 5th and 6th Subgroup and silicon, the transition layer comprising carbon and at least one element from the above-mentioned Group, and the cover layer consisting essentially adamantine carbon, the layer system having a hardness of at last 15 GPa, preferably at least 20 GPa, and an adhesion of at least 3 HF according to VDI 3824, Page 4.

For producing such a layer, a process is used during which, after the substrate is placed in a vacuum chamber and after a pumping-down to a vacuum of less than $10^{-4}$ mbar, preferably $10^{-5}$, the substrate surface is first cleaned in that adhering impurities are removed, while subsequently a plasma-aided vapor depositing of the adhesive layer takes place. Then the transition layer is applied by the simultaneous plasma-aided vapor depositing of the adhesive layer constituents and the depositing of carbon from the gas phase by means of plasma CVD. The application of the adamantine carbon layer then takes place by way of the sole plasma-aided depositing of carbon from the gas phase. During the process, a substrate bias voltage is applied to the substrate which is preferably pulsed in a medium frequency range, and a magnetic field is superimposed which stabilizes the plasma in individual process steps.

A corresponding arrangement for implementing the coating process therefore has a vacuum chamber (1) with a pumping system (9) for generating a vacuum in the vacuum chamber, substrate holding devices (3) for receiving the substrates to be coated, at least one gas supply unit (18) for the metered addition of process gas, at least one vaporizer device (14) for providing coating material for the vapor depositing, an arc generating device (10, 13) for igniting a direct-voltage low-voltage arc, a device (16) for generating a substrate bias voltage, and at least one or several magnetic field generating devices (17) for forming a magnetic far field and/or several close fields.

17 Claims, 6 Drawing Sheets

CROSS FRACTION PHOTO OF A LAYER PRODUCED ACCORDING TO THE INVENTION
200 nm

U.S. PATENT DOCUMENTS

| | | | |
|---|---|---|---|
| 4,731,302 A | * | 3/1988 | Weissmantel et al. |
| 4,842,937 A | * | 6/1989 | Meyer et al. |
| 5,170,563 A | * | 12/1992 | Van der Grijn et al. |
| 5,249,554 A | * | 10/1993 | Tamor et al. |
| 5,266,409 A | * | 11/1993 | Schmidt et al. |
| 5,368,939 A | * | 11/1994 | Kawamura et al. |
| 5,541,003 A | * | 7/1996 | Nakayama et al. |
| 5,629,086 A | * | 5/1997 | Hirano et al. |
| 6,022,622 A | * | 2/2000 | Domoto et al. |
| 6,165,616 A | * | 12/2000 | Lemelson et al. |
| 6,284,376 B1 | * | 9/2001 | Takenouchi et al. |

FOREIGN PATENT DOCUMENTS

| | | | |
|---|---|---|---|
| EP | 600533 | * | 12/1992 |
| EP | 579983 | * | 1/1994 |
| EP | 651069 | * | 5/1995 |
| EP | 781859 | * | 7/1997 |
| EP | 469204 | * | 2/2002 |
| JP | 63286334 | * | 11/1988 |
| WO | 95/16799 | * | 6/1995 |

* cited by examiner

DLC COATING SYSTEM AND PROCESS AND APPARATUS FOR MAKING COATING SYSTEM

The present invention relates to a system for the protection against wear, for the protection against corrosion and for improving the sliding properties and the like, having an adhesive layer for the arrangement on a substrate, a transition layer for the arrangement on the adhesive layer and a cover layer of an adamantine carbon as well as to a process and an arrangement for producing such layer systems.

Despite the prominent properties of adamantine carbon layers (DLC layers), such as high hardness and excellent sliding properties, and many years of worldwide research activities, it has not been possible to produce pure DLC layers which, also in the case of larger layer thicknesses (>1 $\mu$m), exhibit a layer adhesion which is sufficient for an industrial use in typical protection applications against wear and have a sufficient conductivity in order to be able to eliminate the high-frequency (HF) processes for their production which have many disadvantages with respect to production techniques.

Typical protection applications against wear include, on the one hand, applications in the machine construction field, such as protection against sliding abrasion, pitting, cold fusing, etc., particularly on components with surfaces which move against one another, such as gears, pump and cup plungers, piston rings, injector needles, complete bearing sets or their individual components and many others, as well as, on the other hand, applications in the field of material processing for the protection of the tools used for the cutting or forming machining as well as in the case of injection molds.

In addition to the versatile application possibilities in the field of protection against wear, the protection against corrosion is explicitly mentioned here as another promising field of application of such DLC layers.

Currently, because of the high internal tension and the resulting problematic adhesion, particularly in the case of highly stressed surfaces, in the protection against wear, pure DLC layers can be deposited only with small layer thicknesses which are insufficient for many applications or must be changed in their properties by the additional inclusion of foreign atoms, such as silicon, various metals and fluorine. However, the resulting reduction of inherent layer tension and the improvement of the adhesion has always been connected with a clear loss of hardness which, particularly in the field of the protection against wear, can often have a negative effect on the service life of the respectively coated object.

In the case of plasma-supported processes customary today for producing DLC layers, because of the high electric resistance of hard DLC layers, processes with an HF bias or HF plasma (in the following HF=high frequency will apply to all frequencies >10 MHz), particularly with the industrial frequency 13.56 MHz, are frequently used in order to avoid disturbing charges during the coating. The known disadvantages of this technique are interferences with electronically sensitive process control units (HF feedback, transmitter effect, . . . ) which are difficult to control; increased expenditures for avoiding HF flashovers; antenna effect of the substrates to be coated; and a resulting relatively large minimal distance between the material to be coated which prevents an optimal utilization of space and surface in the coating chamber. Thus, in the case of HF processes, closest attention has to be paid to that fact that, for example, as a result of an excessive loading density, incorrect substrate/holder spacing, etc., there will be no overlapping of dark spaces, which causes harmful secondary plasmas. On the one hand, such secondary plasmas cause energy sinks and thus additionally stress the plasma generators; on the other hand, such local plasma concentrations frequently cause a thermal overheating of the substrates and an undesirable graphitization of the layer.

On the basis of the exponential dependence of the substrate voltage on the substrate surface calculated during HF processes, $$U_S/U_E = C_E/C_S = (A_E/A_S)^4$$

wherein U is the voltage; C is the capacity; A is the surface; and S indicates the substrate and E indicates the counterelectrode, as the substrate surface $A_S$ rises, there is a considerable drop of the substrate voltage $U_S$ accompanied by a significant rise of the dissipated energy. As a result, depending on the capacity of the used generators, only a certain maximal surface can be coated. Otherwise, either sufficient power cannot be fed into the system or the potential difference (substrate voltage) cannot be adjusted to be sufficiently high in order to achieve the ion plating effect required for well adhering dense layers.

In addition, on the system side in the case of HF-processes, additional equipment-related expenditures are usually required in order to mutually dynamically adapt generator impedances and plasma impedances by means of electric networks, such as a so-called matchbox, during the process.

In the following various processes and layer systems known from the state of the art will briefly be mentioned.

European Patent Document EP 87 836 discloses a DLC layer system with a 0.1–49.1% fraction of metallic constituents which is deposited, for example, by means of cathodic sputtering.

German Patent Document DE 43 43 354 A1 describes a process for producing a multilayer Ti-containing layer system with a hard-material layer consisting of titanium nitrides, titanium carbides and titanium borides as well as a friction-reducing C-containing surface layer, the Ti fraction and N fraction being progressively reduced in the direction of the surface.

The process described in U.S. Pat. No. 5,078,848 uses a pulsed plasma beam for producing DLC layers. However, on the basis of the targeted particle radiation from a source with a small outlet cross-section, such processes are only conditionally suitable for the uniform coating of larger surfaces.

Various CVD processes and SiDLC/DLC mixed layers produced by means of such processes are described in the following documents:

European Patent Document EP-A-651 069 describes a friction-reducing protection system against wear of 2–5000 alternating DLC and SiDLC layers. A process for depositing a-DLC layers with an Si intermediate layer and an adjoining a-SiC:H transition zone for improving the adhesion is described in European Patent Document EP-A-600 533. European Patent Document EP-A-885 983 and EP-A-856 592 also describe various methods for producing such layers. For example, in European Patent Document EP-A-885 983, the plasma is generated by a DC-heated filament and the substrates are acted upon by negative direct voltage or MF between 30–1,000 kHz (in the following MF=medium frequency is the frequency range between 1 and 10,000 kHz).

U.S. Pat. No. 4,728,529 describes a method for depositing DLC while applying an HF plasma, during which the layer formation takes place in a pressure range of between $10^{-3}$ and 1 mbar consisting of an oxygen-free hydrocarbon plasma to which, as required, a noble gas or hydrogen is admixed.

The process described in German Patent Document DE-C-195 13 614 uses a bipolar substrate voltage with a shorter positive pulse duration in a pressure range between 50–1,000 Pa. As a result, layers are deposited in the range of from 10 nm to 10 μm and of a hardness of between 15–40 GPa.

A CVD process with a substrate voltage which is generated independently of the coating plasma is described in German Patent Document DE-A-198 26 259, in which case, preferably bipolar but also other periodic changed substrate voltages are applied. However, this requires a relatively high-expenditure electric supply unit, because it has to be provided in a twofold construction, for implementing the process.

Correspondingly, it is an object of the present invention to provide relatively thick DLC layer systems with a high hardness and an excellent adhesion which, in addition, still have a sufficiently high conductivity in order to be able to be deposited without HF bias, so that a process and an arrangement can be used which do not require high expenditures and are effective for industrial use. Correspondingly, it is also an object of the invention to provide a corresponding process and a corresponding arrangement.

This object is achieved by means of the layer having the characteristics of claim 1 as well as the process according to claim 11 and the arrangement according to claim 30. Advantageous further developments are the object of the subclaims.

A DLC layer system is obtained by producing a layer with the following layer construction.

An adhesive layer is situated directly on the substrate and has an element from the group of elements of the IV, V and VI Subgroup as well as Si. Preferably an adhesive layer of the elements Cr or Ti is used which were found to be particularly suitable for this purpose.

This layer is followed by a transition layer which is preferably constructed as a gradient layer in whose course the metal content decreases and the C content increases perpendicularly to the substrate surface.

The transition layer comprises essentially carbon and at least one element from the group of elements forming the adhesive layer. In addition, hydrogen may be contained in a preferred embodiment. Furthermore, the transition layer as well as the adhesive layer contain unavoidable impurities, as caused, for example, by atoms from the surrounding atmosphere built into the layer, for example, the noble gases used in the production, such a argon and xenon.

When the transition layer is constructed in the form of a gradient layer, the growth of the carbon in the direction of the cover layer can take place by the increase of possibly different carbidic phases, by the increase of the free carbon or by a mixture of such phases with the metallic phase of the transition layer. In this case, as known to a person skilled in the art, the thickness of the gradient or transition layer can be adjusted by adjusting the individual process ramps. The increase of the C content and the decrease of the metallic phase can take place continuously or in steps; in addition, at least in a portion of the transition layer, a sequence of metal-rich and C-rich individual layers can be provided for the further reduction of layer tensions. As a result of the above-mentioned constructions of the gradient layer, the material characteristics (such as the E module, the structure, etc.) of the adhesive layer and of the final DLC layer are essentially continuously adapted to one another and the danger of a crack formation along an otherwise occurring metal or Si/DLC boundary layer is therefore counteracted.

The end of the layer stack is formed by a layer which essentially consists only of carbon and preferably hydrogen and which, in comparison to the adhesion and transition layer, has a larger layer thickness. In addition to the carbon and hydrogen, noble gases, such as argon or xenon, can also occur here. However, it is important here that additional metallic elements or silicon are completely avoided.

The hardness of the entire DLC layer system is set at a value greater than 15 GPa, preferably greater than/equal to 20 GPa, and an adhesion of better than or equal to HF 3, preferably better than or equal to HF 2, particularly equal to HF 1, according to DVI 3824, Sheet 4, is achieved. The hardness is determined by way of the Knoop Hardness Measurement with 0.1 N load, that is $HK_{0.1}$, so that 20 Gpa correspond to 2,000 $HK_{0.1}$. The surface resistance of the DLC layer is between $\delta=10^{-6} \Omega$ and $\delta=5$ MΩ, preferably between 1Ω and 500 kΩ, at an electrode spacing of 20 mm. Simultaneously, the present DLC layer distinguishes itself by the low coefficients of friction typical of DLC, preferably $\mu \leq$ in the pin/disk test. The layer thicknesses are all >1 μm, preferably >2 μm, the adhesive layer and the transition layer preferably having layer thicknesses of from 0.05 μm to 1.5 μm, particularly of from 0.1 μm to 0.8 μm, while the cover layer preferably has a thickness of from 0.5 μm to 20 μm, particularly of from 1 μm to 10 μm.

The H content in the cover layer is preferably 5 to 30 atomic percent, particularly 10 to 20 atomic percent.

In scanning electron microscope photos, DLC layer systems deposited according to the invention exhibit surfaces of fracture which, in contrast to the conventional DLC layers, have no glassy amorphous structure but a fined-grained structure, the grain size preferably being ≦300 nm, particularly ≦100 nm.

In tribological tests under a high load, the coating has a multiply increased service life in comparison to other DLC layers, such as metal carbon layers, particularly WC/C layers. Thus, on an injection nozzle for internal-combustion engines provided with a DLC layer, only a slight wear could be determined in a test after 1,000 h, whereas, in the same test, a nozzle coated with WC/C failed after 10 h because of high surface wear extending into the base material.

The layer roughness of the DLC layer according to the invention preferably has a value of Ra=0.01–0.04; Rz measured according to DIN being <0.8, preferably <0.5.

The advantages of a DLC layer system according to the invention which has the above-mentioned characteristics are the combination achieved for the first time of large layer thicknesses with an excellent adhesion, which still have a sufficient conductivity for permitting a relatively simple process implementation in industrial production.

Despite the high hardness of >15 GPa, preferably >20 GPa, because of its structure and the process steps according to the invention, the layer exhibits a clearly improved adhesion. Here, conventional layer systems require a doping in the function layer (DLC) in order to reduce the layer tension, which, however, also reduces the hardness.

Also scanning electron microscope fracture photos of the layer according to the invention exhibit a fine-grained straight fracture surface in contrast to the previously known DLC layers which have the typical fracture shape of an amorphous brittle layer with partially conchoidal eruptions. Layers having the above-described property profile are particularly suitable for applications in machine construction, as, for example, for coating highly stressed pump and cup plungers and valve gears, cams and camshafts, as used for motor vehicle combustion engines and transmissions, but also for the protection of highly stressed gears, plungers, pump spindles and other components, in the case of which a particularly hard and smooth surface is required which has good sliding properties.

In the tool field, because of their great hardness and very smooth surface, these layers can advantageously be used mainly for forming (pressing, punching, deep-drawing, . . . ) and injection molding tools but also, with certain limitations when machining iron materials, for cutting tools, particularly if a particularly low coefficient of friction paired with a great hardness is required for the application.

The process according to the invention for producing DLC layer systems is characterized by the following features.

The parts to be coated are cleaned in a manner known for PVD processes and are mounted on a holding device. In contrast to HF processes, holding devices can advantageously be used here with—adapted according to the respective particle geometry—1, 2 or 3 essentially parallel axes of rotation, whereby a greater loading density can be achieved. The holding device with the parts to be coated is moved into the process chamber of a coating system and, after the pumping down to a starting pressure of less than $10^{-4}$ mbar, preferably $10^{-5}$ mbar, the process sequence is started.

The first part of the process—cleaning the substrate surfaces—is carried out, for example, as a heating process in order to remove the volatile substances still adhering to the surface of the parts. For this purpose, similar to German Patent Document DE 28 23 876, a noble gas plasma is preferably ignited by means of a high-current/low-voltage discharge between one or several filaments arranged in an ionization chamber adjoining the process chamber and applied to a negative potential and the holding devices with the parts which is applied to a positive potential. This causes an intensive electron bombardment and therefore a heating of the parts. In this case, as in German Patent Document DE 44 37 269, it was found to be particularly advantageous to use an AR/H2 mixture because a cleaning effect of the parts surfaces is achieved by the reducing effect of the hydrogen. In this case, the high-current/low-voltage arc discharge can be guided by a static or advantageously essentially locally variably moved magnetic field. Instead of the above-described ionization chamber, a hollow cathode or another known ion or electron source can also be used.

As an alternative, other heating processes, such as radiant heating or inductive heating, can naturally also be used.

After a temperature level has been reached which is to be determined according to the base material, in addition or as an alternative, an etching process can be started as a cleaning process in that a low-voltage arc is ignited, for example, between the ionization chamber and an auxiliary anode, and the ions are drawn onto the parts by means of a negative bias voltage of from 50 to 300 V. There, the ions bombard the surface and remove residual impurities. A clean surface is therefore obtained. In addition to noble gases, such as argon, the process atmosphere can also contain hydrogen.

Furthermore, the etching process can also take place by the application of a pulsed substrate bias voltage without or with the assistance of an above-described low-voltage arc, preferably a medium frequency bias in the range of from 1 to 10,000 kHz, particularly between 20 and 250 kHz, being used.

In order to ensure the adhesion of the DLC layer system on the substrate, a preferably metallic adhesive layer particularly consisting of Cr or Ti is vapor-deposited by means of a known PVD or plasma CVD process, such as, for example, arc-type vaporizing, various ion plating processes, however, preferably by cathodic sputtering, of at least one target. For aiding the vapor depositing, a negative substrate bias voltage is applied to the substrate. The ion bombardment and the resulting layer densification during the sputtering process can additionally be aided by a parallel-operated low-voltage arc and/or a magnetic field applied for stabilizing and intensifying the plasma, and/or by applying a DC bias voltage to the substrate or by applying a medium frequency bias between the substrate and the process chamber in the range of from 1 to 10,000, particularly between 20 and 250 kHz.

In a known manner, the thickness of the adhesive layer is set by a selection of the sputtering or vapor depositing time and power corresponding to the respective system geometry.

For example, in the case of the present system geometry described below, Cr is sputtered for the duration of 6 minutes from two advantageously opposite targets at a pressure of between $10^{-4}$ and $10^{-3}$ mbar, a substrate bias of $U_{bias}=-75$ V and a power of approximately 8 kW in an Ar atmosphere.

According to the invention, after the application of the adhesive layer, by applying a transition layer, a transition, which is as fluid as possible is ensured between the adhesive layer and the DLC layer.

The application of the transition layer takes place such that, in addition to the plasma-aided vapor-depositing of the adhesive layer constituents, isochronously, carbon is precipitated from the gas phase. This preferably takes place by way of a plasma CVD process in which a carbon-containing gas, preferably a carburetted hydrogen gas, particularly acetylene, is used as the reaction gas.

During the application of the transition layer, an, in particular, "pulsed" medium-frequency substrate bias voltage is applied to the substrate and a magnetic field is superimposed.

For the preferred formation of a gradient layer, during the application of the transition layer, the fraction of the carbon precipitation is increased in steps or continuously as the thickness of the transition layer increases, until finally essentially only a carbon precipitation still takes place.

In this process stage, the adamantine carbon layer is then generated as the cover layer by a plasma CVD precipitation of carbon from the gas phase, in which case a carbon-containing gas, preferably a carburetted water gas, particularly acetylene, is used as the reaction gas. Simultaneously, a substrate bias voltage continues to be maintained on the substrate, and the superimposed magnetic field is maintained.

In a preferred embodiment, the reaction gas for depositing carbon for forming the transition layer and the cover layer made of adamantine carbon may, in addition to the carbon-containing gas, contain hydrogen and noble gas, preferably argon or xenon. The set pressure in the process chamber in this case is between $10^{-4}$ mbar to $10^{-2}$ mbar.

During the depositing of the cover layer made of adamantine carbon, the fraction of the carbon-containing gas is preferably increased and the fraction of the noble gas, particularly argon, is preferably lowered.

The substrate bias voltage, which is applied during the process steps for vapor depositing the adhesive layer, applying the transition layer and depositing the cover layer on the substrate may, particularly during the formation of the transition layer and of the cover layer, be an alternating voltage (AC), a direct voltage (DC) superimposed with AC or pulse, or a modulated direct voltage, as particularly a unipolar (negative) or bipolar substrate bias voltage, which is pulsed in a medium frequency range of from 1 to 10,000 kHz, preferably from 20 to 250 kHz. In this case, the pulse form may be sinusoidal or asymmetrical, so that long negative and short positive pulse periods or large negative and small positive amplitudes are applied.

Furthermore, preferably during the entire coating process, a longitudinal magnetic field with a uniform course of magnetic flux is set, the magnetic field being variable laterally and/or spatially, continuously or in steps.

Preferably, if a DC bias was used for applying the adhesive layer, when the transition layer is applied, a medium frequency generator is first connected to the holding device, which medium frequency generator emits its voltage pulses (a regulating by controlling the fed power is also possible, but not preferred) in the form of a sinusoidal or of another bipolar or unipolar signal course. In this case, the used frequency range is between 1 and approximately 10,000 kHz, preferably between 20 and 250 kHz; the amplitude voltage is between 100 and 3,000 V, preferably between 500 and 2,500 V. The change of the substrate voltage is preferably carried out by switching-over a generator which is designed especially for the emission of direct and medium frequency voltage. In another advantageous embodiment, a medium frequency voltage is applied to the substrates also for the implementation of the etching and adhesive layer process. When a bipolar substrate voltage is used, it was found to be particularly advantageous to apply asymmetrical pulse forms; for example, the positive pulse can be applied more briefly or with a lower voltage than the negative pulse, because the electrons follow the field more rapidly and, because of their low mass, when impacting, result mainly in an additional heating of the parts, which may result in damage by overheating particularly in the case of temperature-sensitive base materials. Also in the case of different signal courses, this danger can be counteracted by providing a so-called "OFF time", in the case of which a zero signal is applied between the application of individual or several signal periods with a power fraction (="ON time").

Isochronously or with a time delay after the application of the medium frequency signal, when a DC bias is used for the application of the adhesive layer, or after the vapor depositing of the layer thickness desired for the adhesive layer when a medium frequency bias is used, a carburetted hydrogen gas, preferably acetylene, is admitted into the recipient by means of a gas flow which rises in steps or preferably continuously. Also isochronously or with a possibly different time delay, the power of the at least one metallic or Si target is brought down in steps or continuously. Preferably the target is brought down to a minimum power, which can be easily determined by a person skilled in the art according to the achieved hydrocarbon flow, at which minimum power a stable operation is still possible without symptoms of poisoning by the reactive gas. Subsequently, the at least one target is shielded against the process chamber preferably means of one or several movably arranged screens, and is switched off. This measure largely prevents an occupation of the target with a DLC layer, whereby a sputtering free between individual DLC coating batches, which is otherwise necessary, can be eliminated. In the case of the next batch to be implemented, it is sufficient to provide a bringing-up of the at least one target while the screens are closed in order to again achieve a completely bare target surface suitable for the application of the adhesive layer.

A significant contribution to the stabilizing of the DLC coating process according to the invention is made by forming a longitudinal magnetic field. This will take place—unless it was already used in the preceding process step for applying the adhesive layer—essentially isochronously with the switching-over of the substrate voltage to the medium frequency generator. The magnetic field is constructed such that a magnetic flux course exists in the process chamber which is as uniform as possible. For this purpose, preferably by two electromagnetic coils essentially bounding the process chamber on opposite sides, current is introduced such that a mutually reinforcing magnetic field is created which is directed in the same direction at both coils. In the case of smaller chamber dimensions, a sufficient effect may possibly also be achieved by means of only one coil. As a result, an approximately uniform distribution of the medium frequency plasma is achieved over larger chamber volumes. Nevertheless, as a result of different geometries of the parts to be coated and of the holding devices, occasional secondary plasmas may be formed if certain geometrical and electromagnetic marginal conditions are met. This can be counteracted by a magnetic field which is variable with respect to time and space in that the coil currents are displaced together with one another or preferably against one another. For example, a current intensity I first flows for 120 seconds through the first coil which is stronger than that flowing through the second coil. During the subsequent 90 seconds, the current intensity is inverse; that is, the second magnetic field is stronger than the first magnetic field. These magnetic field adjustments can take place periodically, as described, in steps or continuously and thus, by the suitable selection of the corresponding coil currents, the forming of stable secondary plasmas can be avoided.

In contrast to the prior art, it is possible only as a result of the use of the magnetic field and the resulting significant increase of the plasma intensity to achieve, also in low pressure ranges of, for example, from $10^{-3}$ to $10^{-2}$ mbar, a stable CVD process for depositing pure DLC layers with high depositing rates in the range of from 0.5 to 5, preferably between 1–4 $\mu$m/h. In this case, in addition to the substrate current, the plasma intensity is also directly proportional to the activation of the magnetic field. Additionally, both parameters depend on the size of the offered surfaces acted upon by means of a bias. By applying lower process pressures, smoother layers with a lower number of growth defects and a lower contamination by disturbing external elements can be deposited.

In addition to being a function of the process parameters, the growth rate also depends on the loading and the holding device. It is particularly important in this case whether the parts to be coated, rotating once, twice or three times, are fastened on magnetic holding devices or are clamped or fitted in. The overall mass and the plasma transmissibility of the holding devices is also significant. Thus, for example, by means of light-weight holding devices, for example, by using spoke plates instead of plates made of a solid material, higher growth rates and overall a better layer quality is achieved.

For the further increase of the plasma-reinforcing magnetic field, in addition to the longitudinal magnetic field (far field) which penetrates the whole process chamber, additional local magnetic fields—so-called near fields—can be provided. An arrangement is particularly advantageous in the case of which, in addition to at least one magnetron magnetic system of the at least one target, additional, preferably permanent magnetic systems are mounted on the walls bounding the plasma chamber, which have a similar or the same magnetic effect as the at least one magnetron magnetic system. In this case, either all magnetron and additional magnetic systems can have the same construction or preferably a reversal of the polarities can take place. As a result, it is possible to construct the individual near fields of the magnetic and magnetron magnetic systems just like a magnetic enclosure surrounding the process chamber and thus prevent an absorption of the free electrons on the walls of the process chamber.

It is only possible to produce a layer as described above by a combination of the important characteristics of the inventive process. Only the use of plasmas stabilized by magnetic fields as well as the coordinated use of the substrate bias voltage permit the use of the holding devices optimized for conventional PVD processes with a high packing density and process reliability. The process shows how the course and the combination of direct current and medium frequency plasmas can optimally be used for depositing a DLC layer.

Furthermore, the above-mentioned object is achieved by providing an arrangement comprising a vacuum chamber with a pumping system for generating a vacuum in the vacuum chamber, substrate holding devices for receiving the substrates to be coated, at least one gas supply unit for the metered addition of process gas, at least one vaporizer system for providing coating material for vapor depositing, an arc generating device for igniting a direct voltage low-voltage arc, a system for generating a substrate bias voltage, and at least one or several magnetic field generating devices for forming a magnetic far field.

The magnetic field generating devices are preferably formed by at least one Helmholtz coil, preferably a pair of Helmholtz coils.

When Helmholtz coils are used, the magnetic field which can be generated and the magnetic flux density can be controlled locally as well as with respect to time by the current intensity in the coils.

Furthermore, the arrangement comprises a device for generating a substrate bias voltage which continuously or in steps can change the applied substrate bias voltage and correspondingly can also be operated in a bipolar or unipolar manner. In particular, the device is suitable for generating a substrate bias voltage which is pulsed in the medium frequency range.

The vaporizing devices used in the arrangement comprise sputter targets, particularly magnetron sputter targets, arc sources, thermal evaporators and the like. It is advantageous that the vaporizer device can be separated from the remaining process chamber, for example, by means of swivellable screens.

The arrangement advantageously has a substrate heater in the form of an inductive heater, a radiant heating system or the like, in order to be able to clean the substrates in a heating step before the coating. However, the igniting of a plasma is preferably used.

Among other things, a low-voltage arc generating device is provided in the arrangement for this purpose, which comprises an ion source with a filament, preferably a refractory filament made of tungsten, tantalum or the like, in an ionization chamber as well as an anode and a direct voltage supply. In this case, the ion source is connected with the negative pole of the direct voltage supply. Preferably, the positive pole of the direct voltage supply can optionally be connected with the anode or the substrate holding devices, so that a low-voltage arc can be ignited between the ion source and the anode or the ion source and the substrates. Similar to the vaporizer device, the ion source can also be separated from the actual process chamber, for example, by means of a hole metal plate made of tungsten, tantalum or a similar refractory metal.

In order to permit a uniform coating process for all sides of the substrates, it is also provided that the substrate holding devices are movable and can preferably rotate about at least one or several axes.

As a result of the advantageous combination of the medium-frequency substrate voltage supply and a Helmholtz coil arrangement, which can also be implemented by laterally mounted coils comprising two opposite targets, it is, for the first time possible at an industrial scale to utilize also in the case of low pressures a stable medium frequency plasma for carrying out a DLC process. In contrast to DLC layers produced by means of other systems, the thus produced layers have considerably improved properties.

By means of the present coating arrangement and the above-described process, thick pure DLC layers with an excellent adhesion can be produced for the first time. In addition, when the process parameters are changed, a majority of the previously known plasma processes for producing metal carbon or mixed layers with other elements, such as silicon or F, and for producing multipart layers or simple known layer systems deposited by means of PVD and/or CVD processes can be carried out.

Additional advantages, features and characteristics of the invention are illustrated by means of the following detailed description of preferred embodiments by means of the attached drawings.

Figure 1:
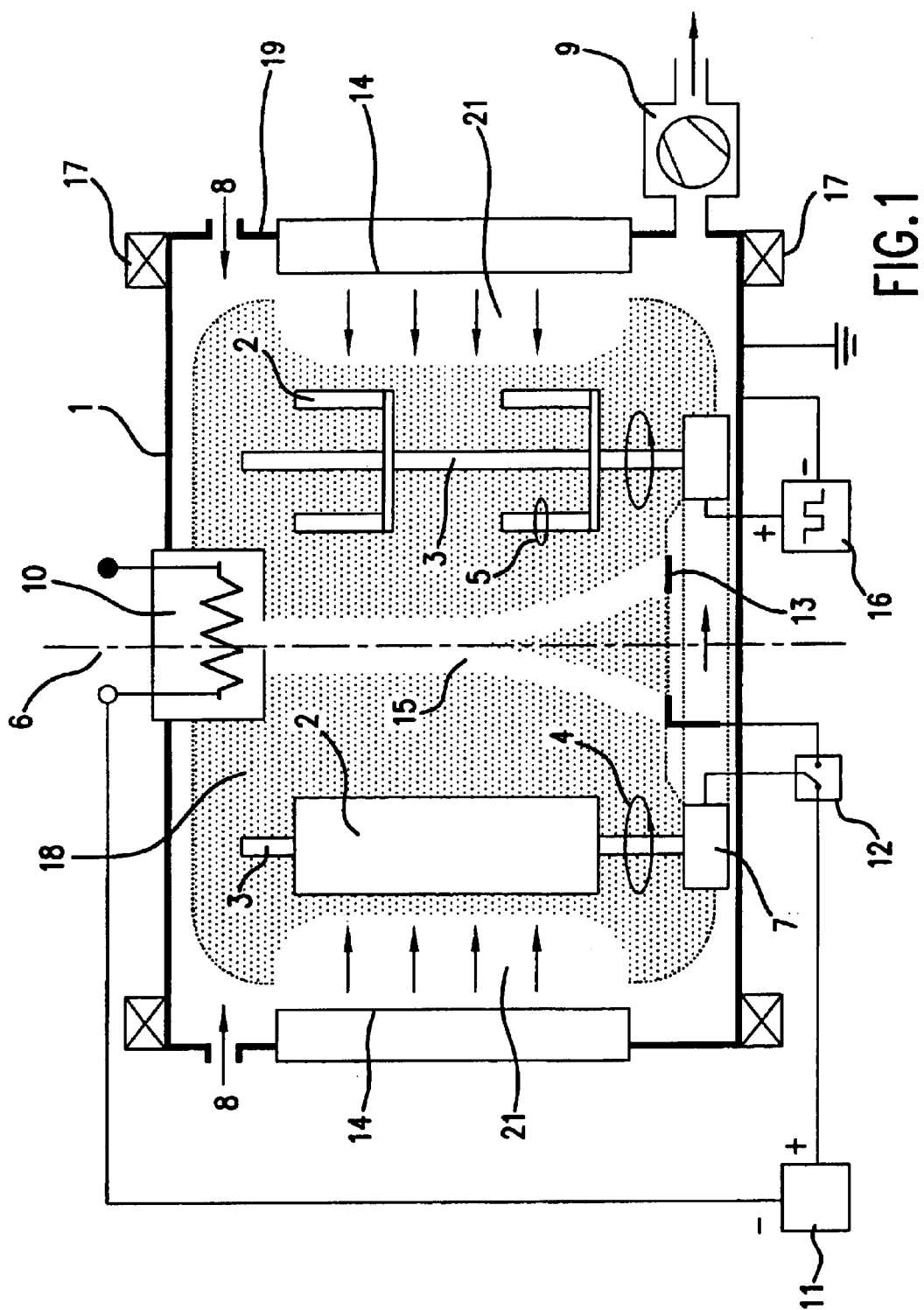
FIG. 1 is a schematic cross-sectional view of the arrangement according to the invention.

FIG. 1 is a schematic cross-sectional view of the process chamber 1 of a coating arrangement according to the invention. The parts 2 to be coated are mounted on one or several holding devices 3 which comprises devices for generating an at least single rotation 4, as required, a double rotation 5 of the parts. In a particularly advantageous embodiment, the holding devices 3 are positioned on a carrousel 17 which additionally can be rotated about the axis 6 of the arrangement.

By way of gas inlets 8, the different process gases, particularly Ar and acetylene, can be fed into the process chamber by means of suitable regulating devices which are not shown here.

A pumping stand 9 which is suitable for a high vacuum is flanged to the chamber.

An ion source 10 is preferably arranged in the area of the axis of the arrangement and is connected to the negative output of a direct voltage supply 11. Depending on the process step, the positive pole of the direct voltage supply 11 can be applied by way of a switch 12 to the carrousel 7 and to the holding device 3 and the parts 2 electrically connected therewith (heat process) or to the auxiliary anode 13 (etching process or, as required, also during the coating processes).

On the walls of the process chamber 1, at least one vaporizer source 14, preferably a magnetron or an arc vaporizer, is provided for applying the adhesive and gradient layer. In another embodiment of the vaporizer source 14, which is not shown here, this vaporizer source 14 can be mounted as an anodically switched pot centrally in the floor of the process chamber 1. In this case, the vaporization material is changed into the gas phase for producing the transition or gradient layer by means of heating by the low-voltage arc 15.

Furthermore, an additional electric voltage supply 16 is provided by means of which a periodically variable medium frequency voltage in the range of between 1 to 10,000, preferably between 20 and 250 kHz, can be applied to the substrates.

The electromagnetic coils 17 for generating a longitudinal magnetic field penetrating the plasma space are arranged on opposite boundary walls of the process chamber 1 and are fed in the same direction by at least one, preferably two separate DC voltage sources which are not shown here in detail.

Figure 2:
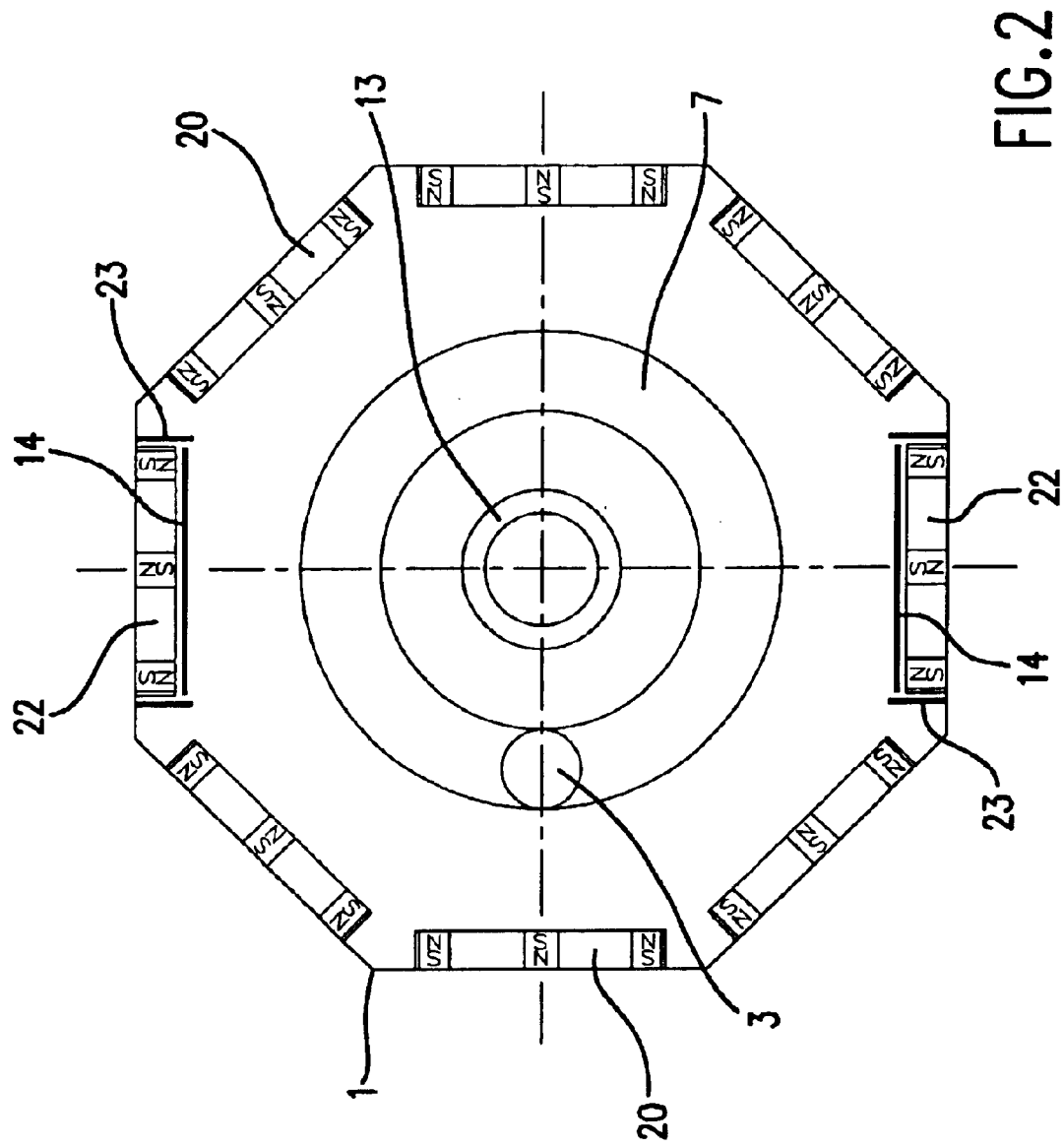
FIG. 2 is a schematic top view of the arrangement of the invention according to FIG. 1.

As additional measures for intensifying and more uniformly shaping the magnetic field and thus the MF plasma 18, magnetic systems 20 for forming several magnetic near fields 21 can be mounted on the side walls 19 of the plasma chamber 1. In this case, advantageously and optionally while including the at least one magnetron magnetic system 22, as illustrated, for example, in FIG. 2, alternately magnetic systems with an NSN and an SNS polarity are arranged and thus a magnetic tunnel-shaped loop-shaped inclusion of the plasma is caused in the process chamber.

The magnetic systems 20 for the generating the near field are preferably constructed as magnetron magnetic systems.

The individual systems of the coating arrangement are advantageously entered into a relationship with one another by a process control. As a result, it is possible, in addition to the basic functions of a vacuum coating arrangement (pumping stand control, safety control circuits), to mutually adapt in a flexible manner the various plasma-generating systems, such as magnetrons with the magnetron supply not described here in detail, the ionization chamber 1 and the auxiliary anode 13 or the carrousel 7 and the direct-voltage supply 11, as well as the carrousel 7 and the medium frequency generator 16 as well as the corresponding adjustment of the gas flows, as well as the controlling of the optionally different coil currents and to optimize them for different processes.

Figure 3:
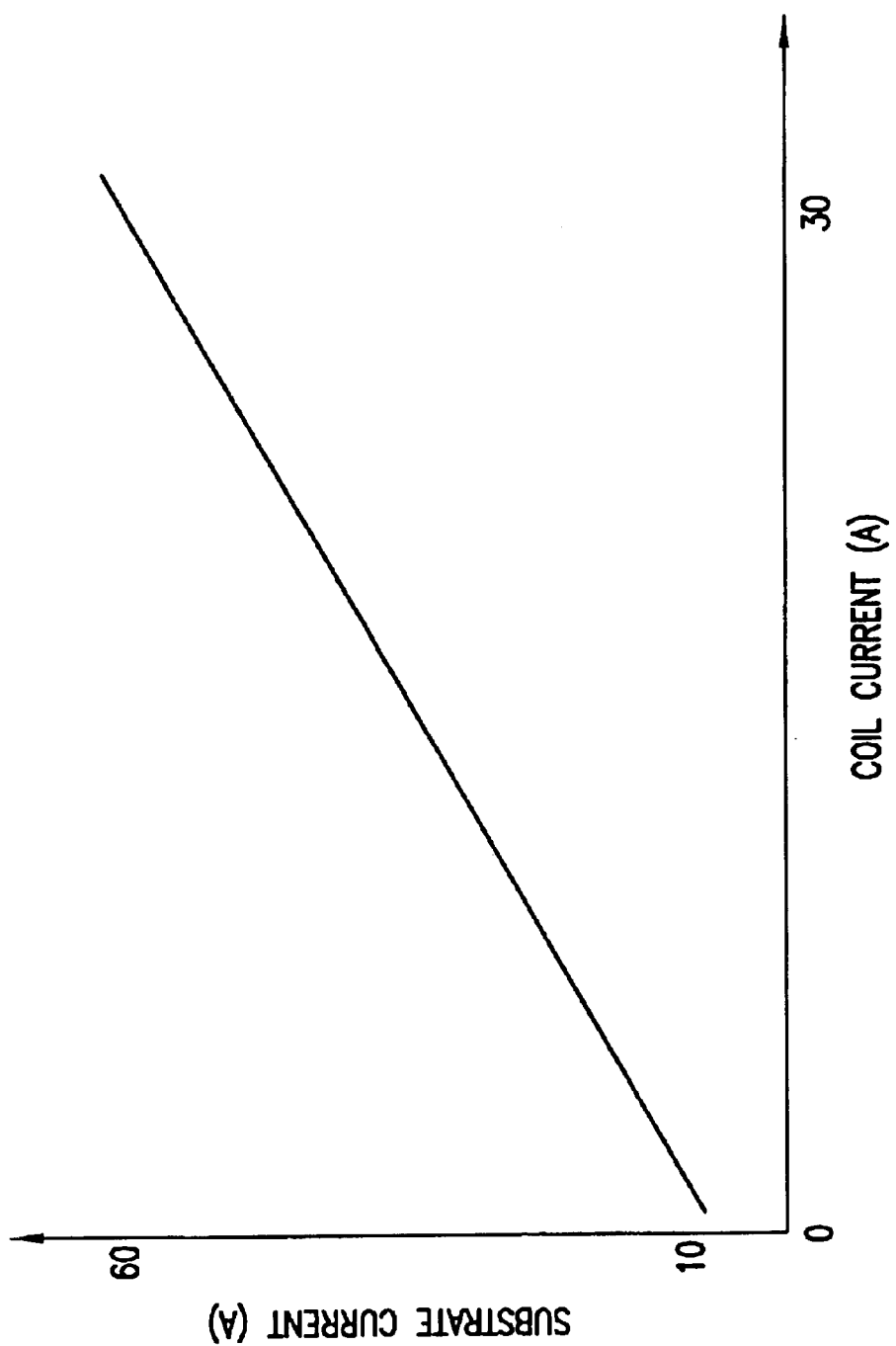
FIG. 3 is a schematic view of the influence of the coil current on the substrate current.

FIG. 3 illustrates the relationship between the substrate current and the coil current when using Helmholtz coils for building up a magnetic field. It was found that the substrate current and thus the plasma intensity are directly proportional to the coil current and thus to the magnetic field buildup. This is clearly demonstrated by the positive effect of a superimposed magnetic field.

Figure 4:
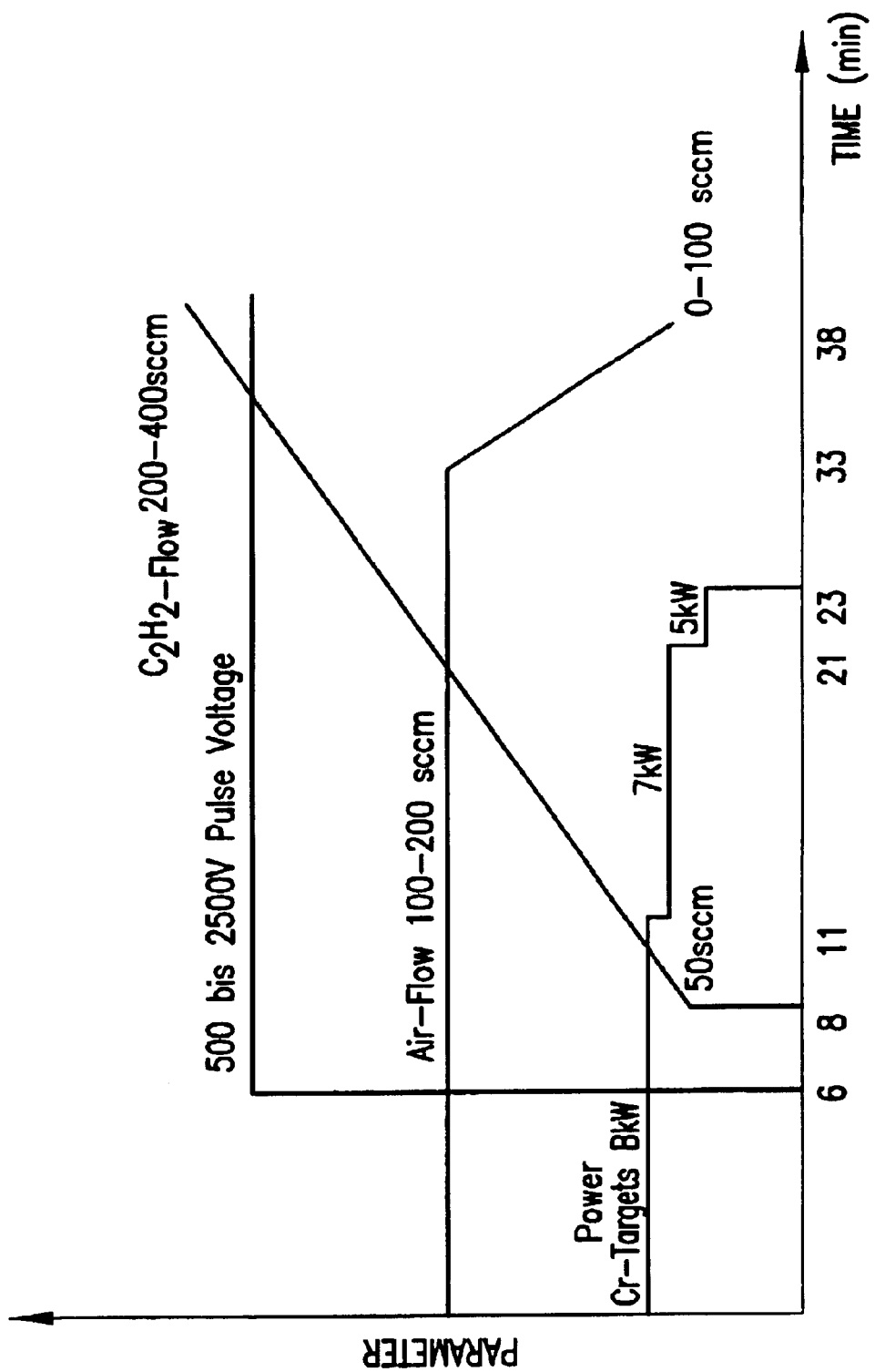
FIG. 4 is a schematic view of the process parameter gradient layer.

As an example, FIG. 4 illustrates the course of individual parameters during the application of a gradient layer: While otherwise the parameters remain the same in comparison to the adhesive layer, the substrate bias is switched over from direct current to medium frequency with a preferred amplitude voltage of between 500 and 2,500 V and a frequency between 20 and 250 kHz. After approximately 2 minutes, an acetylene ramp is started at 50 sccm and is raised over a time period of approximately 30 minutes to 350 sccm. Approximately 5 minutes after switching on the medium frequency generator, the power of the used Cr target is reduced to 7 kW; after another 10 minutes, it is reduced to 5 kW and is held constant there for another 2 minutes. Subsequently, screens are moved in front of the targets and these are switched off, whereby the depositing of the "pure" DLC layer starts which is constructed essentially of carbon atoms, of low quantities of hydrogen and of still lower quantities of argon atoms.

For this purpose, in the simplest case, the process can be completed with switched-off vaporizing sources, but otherwise with the same parameters as in the case of the preceding gradient layer. However, it was found to be advantageous to increase in the course of the deposition of the pure DLC layer either the hydrocarbon fraction in the gas flow, to lower the noble gas fraction or, particularly preferably, to carry out both measures jointly. Here also, a forming of a longitudinal magnetic field, as described above, again has a special significance for maintaining a stable plasma.

Figure 5:
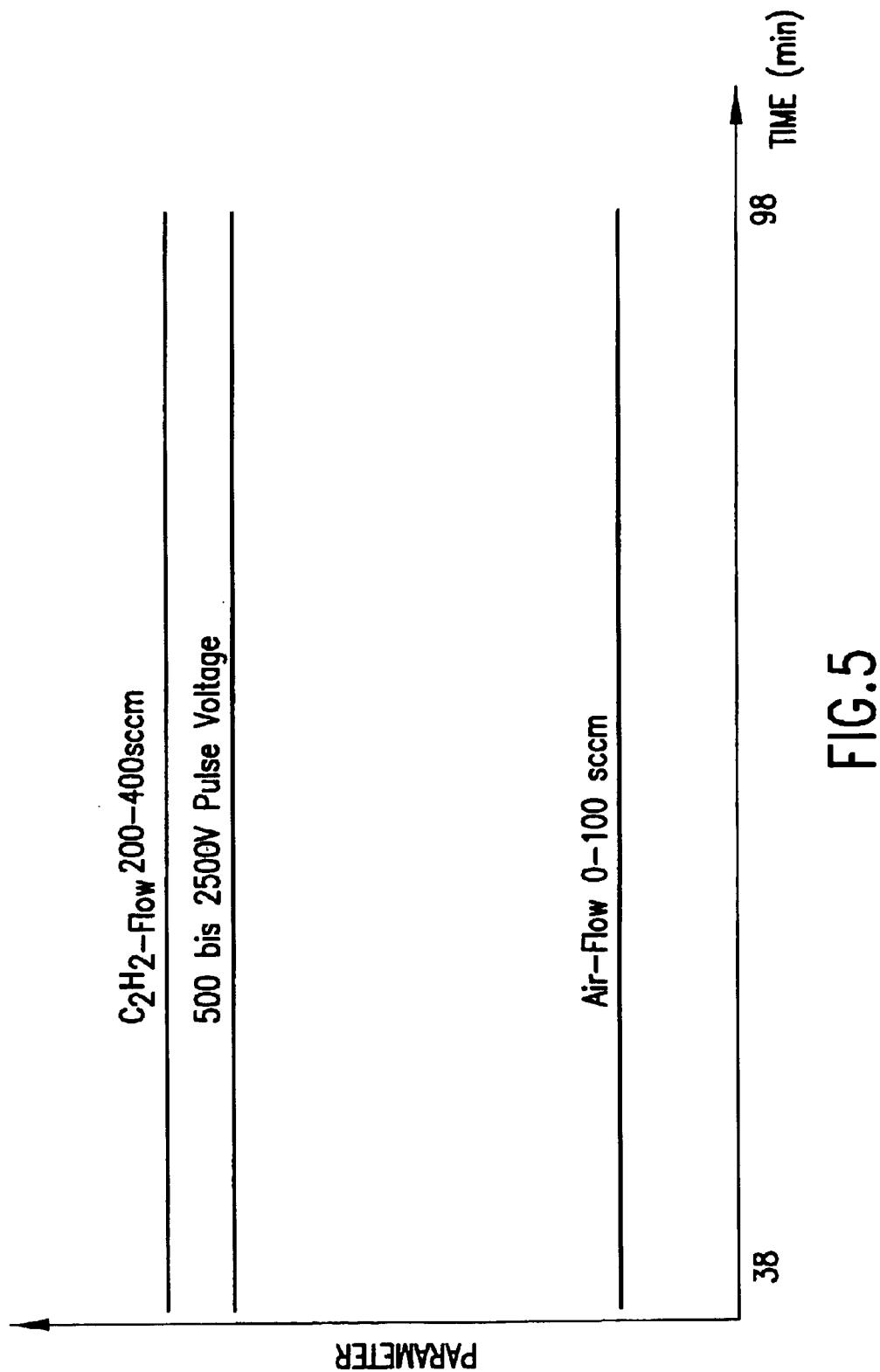
FIG. 5 is a schematic view of the process parameter DLC layer.

In the manner of examples, FIGS. 4 and 5 show the course of individual parameters during the application of the pure DLC layer: After the switching-off of the used Cr target, while the medium frequency supply is adjusted to remain constant and the argon flow remains the same, the acetylene ramp started during the gradient layer is increased for approximately 10 minutes uniformly to a flow between approximately 200 and 400 sccm. Subsequently, for a time period of 5 minutes, the argon flow is continuously reduced to a flow between approximately 0 and 100 sccm. During the next 55 minutes, the process is completed while the adjustments remain the same.

Figure 6:
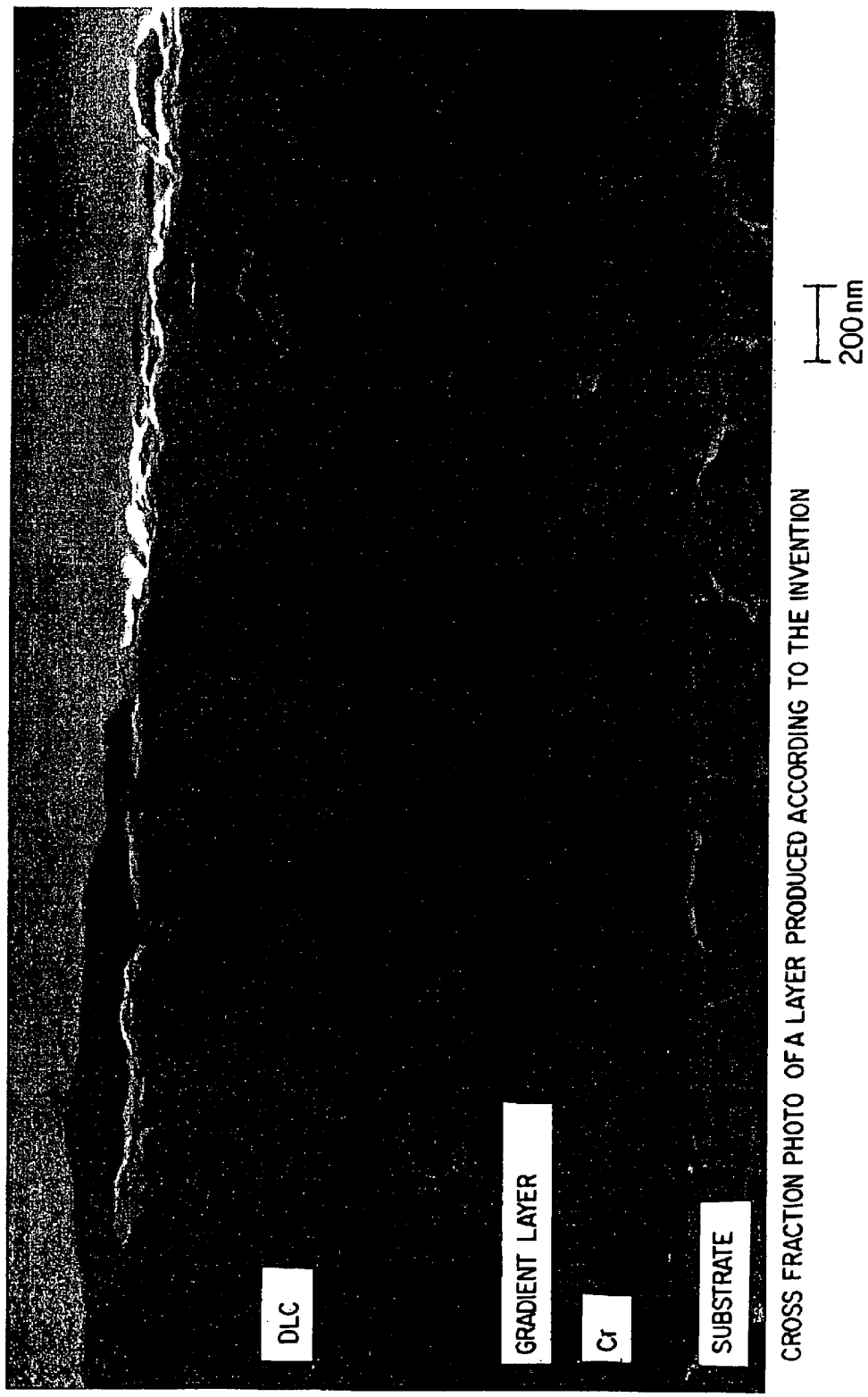
FIG. 6 is a scanning electron microscope fracture photo of a DLC layer according to the invention.

FIG. 6 is a scanning-electron-microscopic photo of a fracture surface of a DLC layer system according to the invention. It is clearly demonstrated that a fine-grained structure exists in the area of the cover layer made of an adamantine carbon, so that the DLC layer has a polycrystalline character.

EMBODIMENT OF THE INVENTION IN THE EXAMPLE

Process Example 1

Heating Process

The process chamber is pumped down to a pressure of approximately $10^{-5}$ mbar and the process sequence is started. As a first part of the process, a heating process is carried out in order to bring the substrates to be coated to a higher temperature and to remove volatile substances from the surface. In this process, an Ar hydrogen plasma is ignited by means of a low-voltage arc between the ionization chamber and an auxiliary anode. The following Table 1 shows the process parameters of the heating process:

| | |
|---|---|
| Ar Flow | 75 sccm |
| Substrate Bias Voltage [V] | 0 |
| Current of the Low-Voltage Arc | 100 A |
| Hydrogen Flow | 170 sccm |
| Current Upper Coil A | Pulsating between 20 and 10 |
| Current Lower Coil | Pulsating Diametrically Opposed between 2 and 5 A |
| Period between Max. and Min. Coil Current | 1.5 min. |
| Heating Time | 20 min. |

The Helmholtz coils are used for activating the plasma and are cyclically controlled. In this case, the current of the upper coil is varied with a period of 1.5 min. between 20 and 10 A; the current of the lower coil varies with the same timing in a diametrically opposite manner between 5 and 20 A.

The substrates heat up in the process and the disturbing volatile substances adhering to the surface are driven into the gas atmosphere, where they are sucked off by the vacuum pumps.

Etching Process

When a uniform temperature has been reached, an etching process is started in that the ions are drawn from the low voltage arc by means of a negative bias voltage of 150 V onto the substrates. The alignment of the low-voltage arc and the intensity of the plasma are aided in this case by the pair of Helmholtz coils mounted in a horizontal alignment. The following table shows the parameters of the etching process

| Ar Flow | 75 sccm |
|---|---|
| Substrate Voltage | −150 V |
| Low-Voltage Arc Current | 150 A |

Cr Adhesive Layer

The application of the Cr adhesive layer is started in that the Cr magnetron sputter targets are activated. The Ar gas flow is adjusted to 115 sccm. The Cr sputter targets are triggered by means of a power of 8 kW and the substrates are moved past the targets for a time of only 6 minutes. The occurring pressure range will then be between $10^{-3}$ mbar and $10^{-4}$ mbar. The sputtering process is aided by the connection of the low-voltage arc and the application of a negative DC bias voltage of 75 V to the substrate.

After half the Cr sputtering time, the low voltage arc is switched off and the depositing is carried out for the remainder of the Cr sputtering time only by means of the plasma active in front of the Cr target.

Gradient Layer

After the expiration of this time, by means of switching on a sine wave generator, a plasma is ignited, acetylene gas with an initial pressure of 50 sccm is admitted and the flow is increased each minute by 10 sccm.

In this case, the sine plasma generator is set at a frequency of 40 kHz to an amplitude voltage of 2,400 V. The generator ignites a plasma discharge between the substrate holding devices and the housing wall. In this case, the Helmholtz coils mounted on the recipient are both activated by means of a constant current flow of 3 A in the lower coil and 10 A in the upper coil. In the case of an acetylene flow of 230 sccm, the Cr targets are deactivated.

DLC Coating

When the flow of the acetylene has reached the value of 350 sccm, the Ar flow is reduced to a value of 50 sccm.

The table shows the parameters of the example in an overview:

| Argon Flow | 50 sccm |
|---|---|
| Acetylene Flow | 350 sccm |
| Excitation Current Upper Coil | 10 A |
| Excitation Current Lower Coil | 3 A |
| Voltage Amplitude | 2,400 V |
| Excitation Frequency f | 40 kHz |

Under these conditions, a high depositing rate is ensured and the ionization of the plasma is maintained by means of the Ar gas. The depositing rate which now occurs in the coating process will be in the range of between 0.5 and 4 µm/h, which also depends on the surface to be coated in the process chamber.

After the expiration of the coating time, the sine wave generator and the gas flow are switched off, and the substrates are removed form the process chamber.

The properties of the forming layer are illustrated in the following table:

| Properties Example 1 | |
|---|---|
| Micro Hardness | >2,200 HK |
| Depositing Rate | 1–2 µm/h |
| Adhesion | HF1 |
| Resistance | <10 kOhm |
| Hydrogen Content | 12% |
| Coefficient of Friction | 0.2 |
| Internal Tension | Approx. 2 GPa |
| Fraction Behavior | Not glassy |

Process Example 2

Process Example 2 provides an implementation similar to Example 1. In contrast to Example 1, the plasma is generated by a bipolar pulse generator. The excitation frequency is at 50 kHz with an amplitude voltage of 700V.

The table shows the parameters of the 2nd example.

| Argon Flow | 50 sccm |
|---|---|
| Acetylene Flow | 350 sccm |
| Excitation Current Upper Coil | 10 A |
| Excitation Current Lower Coil | 3 A |
| Voltage Amplitude | 700 V |
| Excitation Frequency f | 50 kHz |

The produced coating has a hardness of 25 GPa, an adhesion of HF1 and results in a coefficient of friction of 0.2.

| Properties Example 2 | |
|---|---|
| HK | >2,400 |
| Depositing Rate | Approx. 1.5 µm/h |
| Adhesion | HF1 |
| Resistance | <500 kOhm |
| Hydrogen Content | 13% |
| Coefficient of Friction | 0.2 |
| Internal Tension | Approx. 3 GPa |

Process Example 3

Process Example 3 provides an implementation similar to Example 1. In contrast to Example 1, the plasma is excited by a unipolar pulse voltage. The parameters of the test are shown in the following table.

| Argon Flow | 50 sccm |
|---|---|
| Acetylene Flow | 350 sccm |
| Excitation Current Upper Coil | 10 A |
| Excitation Current Lower Coil | 10 A |
| Voltage Amplitude | 1,150 V |
| Excitation Frequency f | 30 kHz |

The produced coating has the properties described in the following table.

| Properties Example 3 | |
|---|---|
| Micro Hardness | 2,500 HK |
| Depositing Rate | Approx. 1.8 µm/h |

-continued

| Properties Example 3 | |
| --- | --- |
| Adhesion | HF1 |
| Resistance | <1 kOhm |
| Hydrogen Content | 12 to 16% |
| Coefficient of Friction | 0.2 |
| Internal Tension | Approx. 2 GPa |

Process Example 4

In comparison to Process Example 1, a process without assistance by a longitudinal magnetic field was carried out in Example 4. The current flowing through the two coils was reduced to a value of 0 A. The table shows the process parameters.

| | |
| --- | --- |
| Argon Flow | 50 sccm |
| Acetylene Flow | 350 sccm |
| Excitation Current Upper Coil | 0 A |
| Excitation Current Lower Coil | 0 A |
| Voltage Amplitude | 2,400 V |
| Excitation Frequency f | 40 kHz |

A plasma is obtained which, in comparison to Example 1, is stable only at higher pressures than in Example 1; is inhomogeneously distributed over the process chamber, and is influenced by geometrical effects. A depositing rate therefore occurs which is inhomogeneous in the process chamber and lower than in Example 1 because of the set process pressure. At the endeavored process pressures, a plasma formation was not possible without the use of a second plasma source, such as a target or the connection of the filament. The plasma in the process chamber could be stabilized only by the use of the Helmholtz coils and a homogeneous deposition could be achieved over the height of the process chamber. Without the use of coils, a plasma ignited in the range of the ionization chamber, where locally high temperatures are generated and destruction has to be feared.

| Properties Example 4 | |
| --- | --- |
| HK | Inhomogeneous 1,300–2,500 |
| Depositing Rate | Inhomogeneous |
| Resistance | Inhomogeneous |
| Adhesion | Cannot be determined |

List of Reference Numbers

1 Process chamber
2 parts to be coated
3 holding device
4 single rotation
5 double rotation
6 axis of arrangement
7 carrousel
8 gas inlet
9 pumping stand
10 ion source
11 direct-voltage supply
12 switch
13 auxiliary anode
14 vaporizer source
15 low-voltage arc
16 voltage supply
17 electromagnetic coil
18 MF plasma
19 side wall
20 magnetic systems
21 near fields
22 magnetron magnetic system

What is claimed is:

1. Layer system for the protection against wear, for the protection against corrosion and for improving the sliding properties and the like, having an adhesive layer for the arrangement on a substrate, a transition layer for the arrangement on the adhesive layer and a cover layer of an adamantine carbon, wherein the adhesive layer comprises at least one element from the Group which contains the elements of the 4th, 5th and 6th Subgroup and silicon, the transition layer comprises carbon and at least one element from the Group which contains the elements of the 4th, 5th and 6th Subgroup as well as silicon, and the cover layer comprises essentially adamantine carbon, the layer system having a hardness of at last 15 GPa, and an adhesion of at least 3 HF.

2. Layer system according to claim 1, characterized in that the transition layer is an individual or multipart gradient layer which changes in its composition continuously or in steps, and specifically with a carbon fraction which increases from the direction of the substrate and a fraction of at least one element of the Group containing the elements of the 4th, 5th and 6th Subgroup as well as silicon, which decreases from the direction of the substrate.

3. Layer system according to claim 1, wherein, in comparison to the adhesive layer and to the transition layer, the cover layer has a larger thickness.

4. Layer system according to claim 1, wherein the transition layer and/or the cover layer additionally comprises hydrogen and unavoidable impurities, the unavoidable impurities comprising noble gases.

5. Layer system according to claim 4, characterized in that the cover layer contains only carbon or carbon and hydrogen.

6. Layer system according to claim 4, characterized in that the cover layer has a hydrogen content of 5 to 30 atomic %.

7. The layer system according to claim 4, wherein said noble gases include argon and xenon.

8. The layer system according to claim 4, wherein said hydrogen content is between 10 to 20 atomic %.

9. Layer system according to claim 1, wherein the at least one element from the Group comprising the elements of the 4th, 5th and 6th Subgroup is titanium and/or chromium.

10. Layer system according to claim 1, wherein the adhesive layer and the transition layer each has a thickness of from 0.05 µm to 1.5 µm.

11. The layer system according to claim 10, wherein the thickness of each of said adhesive layer and said transition layer is from 0.1 microns to 0.8 microns.

12. Layer system according to claim 1, wherein the cover layer has a thickness of from 0.5 µm to 20 µm.

13. Layer system according to claim 12, wherein the cover layer has thickness of from 1 µm to 10 µm.

14. Layer system according to claim 1, wherein the cover layer consisting of adamantine carbon has a fine-grained layer structure with a roughness value of less than 0.8.

15. Layer system according to claim 14, wherein the fine-grained layer structure has a roughness value of less than 0.5.

16. The layer system according to claim 1, wherein said hardness is at least 20 GPA.

17. Layer system for the protection against wear, for the protection against corrosion and for improving the sliding properties and the like, having an adhesive layer for the arrangement on a substrate, a transition layer for the arrangement on the adhesive layer and a cover layer of an adamantine carbon, wherein the adhesive layer comprises at least one element from the Group which contains the elements of the 4th, 5th and 6th Subgroup and silicon, the transition layer comprises carbon and at least one element from the Group which contains the elements V, Cr, Zr, Nb, Mo, Hf, Ta and W, and the cover layer comprises essentially adamantine carbon, the layer system having a hardness of at last 15 GPa, and an adhesion of at least 3 HF.

* * * * *

UNITED STATES PATENT AND TRADEMARK OFFICE
CERTIFICATE OF CORRECTION

PATENT NO. : 6,740,393 B1
DATED : May 25, 2004
INVENTOR(S) : Orlaw Massler et al.

It is certified that error appears in the above-identified patent and that said Letters Patent is hereby corrected as shown below:

<u>Column 16,</u>
Lines 11-22, claim 1 should read as follows:
-- 1. Layer system for the protection against wear, for the protection against corrosion and for improving the sliding properties and the like, having an adhesive layer for the arrangement on a substrate, a transition layer for the arrangement on the adhesive layer and a cover layer of an adamantine carbon,
  wherein the adhesive layer comprises at least one element from the Group which contains the elements of the 4th, 5th and 6th Subgroup and silicon, the transition layer comprises carbon and at least one element from the Group which contains the elements of the 4th, 5th and 6th Subgroup as well as silicon, and the cover layer comprises essentially adamantine carbon, the layer system having a hardness of at least 15 GPa, and an adhesion of at least 3 HF. --.

Signed and Sealed this

Seventeenth Day of January, 2006

JON W. DUDAS
*Director of the United States Patent and Trademark Office*

UNITED STATES PATENT AND TRADEMARK OFFICE
CERTIFICATE OF CORRECTION

PATENT NO. : 6,740,393 B1
APPLICATION NO. : 09/551883
DATED : May 25, 2004
INVENTOR(S) : Orlaw Massler et al.

It is certified that error appears in the above-identified patent and that said Letters Patent is hereby corrected as shown below:

This is the sole correction.

Please substitute the following new claim 17 for the existing claim 17 in column 17, lines 1-8; column 18, lines 1-6.

17. Layer system for the protection against wear, for the protection against corrosion and for improving the sliding properties and the like, having an adhesive layer for the arrangement on substrate, a transition layer for the arrangement on the adhesive layer and a cover layer of an adamantine carbon.

wherein the adhesive layer comprises at least one element from the Group which contains the elements of the $4^{th}$, $5^{th}$ and $6^{th}$ Subgroup and silicon, the transition layer comprises carbon and at least one element from the Group which contains the elements V, Cr, Zr, Nb, Mo, Hf, Ta and W, and the cover layer comprises essentially adamantine carbon, the layer system having a hardness of at least 15 GPa, and an adhesion of at least 3 HF.

Signed and Sealed this

Tenth Day of October, 2006

JON W. DUDAS
*Director of the United States Patent and Trademark Office*

UNITED STATES PATENT AND TRADEMARK OFFICE
Certificate

Patent No. 6,740,393 B1                                                    Patented: May 25, 2004

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Orlaw Massler, Eschen (LI); Mauro Pedrazzini, Eschen (LI); Christian Wohlrab, Rueti/ZH (CH); Hubert Eberle, Planken (LI); Martin Grischke, Triesen (LI); and Thorsten Michler, Mainz (DE).

Signed and sealed this Eighth Day of June 2010.

JENNIFER MCNEIL
*Supervisory Patent Examiner*
Art Unit 1784